United States Patent [19]

Lin

[11] Patent Number: 5,477,916

[45] Date of Patent: Dec. 26, 1995

[54] RETAINER FRAME ASSEMBLY FOR DISSIPATING HEAT GENERATED ON AN INTEGRATED CIRCUIT CHIP

[76] Inventor: Shih-jen Lin, 1st Fl., No. 360, Tanan Rd., Taipei, Taiwan

[21] Appl. No.: 394,609

[22] Filed: Feb. 27, 1995

[51] Int. Cl.⁶ .............................. H05K 7/20; H01L 23/02
[52] U.S. Cl. ...................... 165/80.3; 165/185; 257/718; 361/704
[58] Field of Search ................................. 165/80.2, 80.3, 165/185; 174/16.3; 257/718, 719, 722; 361/704, 709, 710, 717, 718

[56] References Cited

U.S. PATENT DOCUMENTS

| | | | |
|---|---|---|---|
| 4,509,839 | 4/1985 | Lavochkin | 257/718 |
| 5,019,940 | 5/1991 | Clemens | 165/80.3 X |
| 5,307,239 | 4/1994 | McCarty et al. | 361/704 |
| 5,386,338 | 1/1995 | Jordan et al. | 361/704 |

*Primary Examiner*—Allen J. Flanigan
*Attorney, Agent, or Firm*—Parkhurst, Wendel & Rossi

[57] ABSTRACT

A retainer frame assembly for dissipating heat generated on an integrated circuit chip comprising a generally rectangular base frame configured to enclose a chip, a heat-dissipating cover to be disposed on the chip and a movable rod manipulatable to be in a non-locked position, in which the cover loosely rests on the chip, or a locked position, in which the cover is pressingly retained to the chip. The retention of the cover to the chip is achieved by a first positioning piece provided on one side of the base frame and a second positioning piece provided on an opposite side of the base frame and a first and a second complementary locking pieces adjacent to the first positioning piece, in cooperation with the movable rod. The rod is substantially L-shaped having an intermediate offset portion which, when the rod is rotated about its axis, changes position to correspond to the non-locked position and the locked position.

3 Claims, 3 Drawing Sheets

RETAINER FRAME ASSEMBLY FOR DISSIPATING HEAT GENERATED ON AN INTEGRATED CIRCUIT CHIP

BACKGROUND OF THE INVENTION

The present invention relates to a retainer frame assembly for retaining a heat-dissipating cover upon an integrated circuit chip to be cooled, and more particularly, to a retainer frame assembly which allows an exact contact of the chip with the heat-dissipating cover to facilitate a reliable heat-dissipation on the chip.

Prior retainer frame assemblies for a heat-dissipating purpose are known to comprise a base frame having side clips thereon and a heat-dissipating cover to be retained by the base frame, with an integrated circuit chip being disposed under the cover in a contacting manner. In this type of retainer frame assembly, the clips on the base frame which generally project inward may, on the one hand, interfere with insertion of an integrated circuit chip within the base frame. On the other hand, the clips might fail to properly retain the heat-dissipating cover and the integrated circuit chip in exact contact such that the cooling efficiency will be very poor.

SUMMARY OF THE INVENTION

The present invention provides a retainer frame assembly comprising a base frame having retaining means thereon, a heat-dissipating cover to be securely retained to the base frame and a movable rod, with an integrated circuit chip enclosed by the base frame and covered in a surface-contacting manner by the heat-dissipating cover. The retaining means couples the base frame to the heat-dissipating cover in such a manner that a reliable and exact contact between the heat-dissipating cover and the chip is ensured to achieve a good cooling effect of the latter.

With the retainer frame assembly of the invention, the chip can be conveniently disposed within the base frame. The heat-dissipating cover then can be easily disposed onto the chip and locked to the base frame in a precisely-contacting manner.

These and various other advantages and features of novelty which characterize the retainer frame assembly are pointed out with particularity in the claims annexed hereto and forming a part hereof. However, for a better understanding of the invention, its advantages, and the objects obtained by its use, reference should be made to the drawings which form a part hereof, and to the accompanying descriptive matter, in which there is illustrated and described a preferred embodiment of the invention.

DESCRIPTION OF THE PREFERRED EMBODIMENTS

Figure 1:
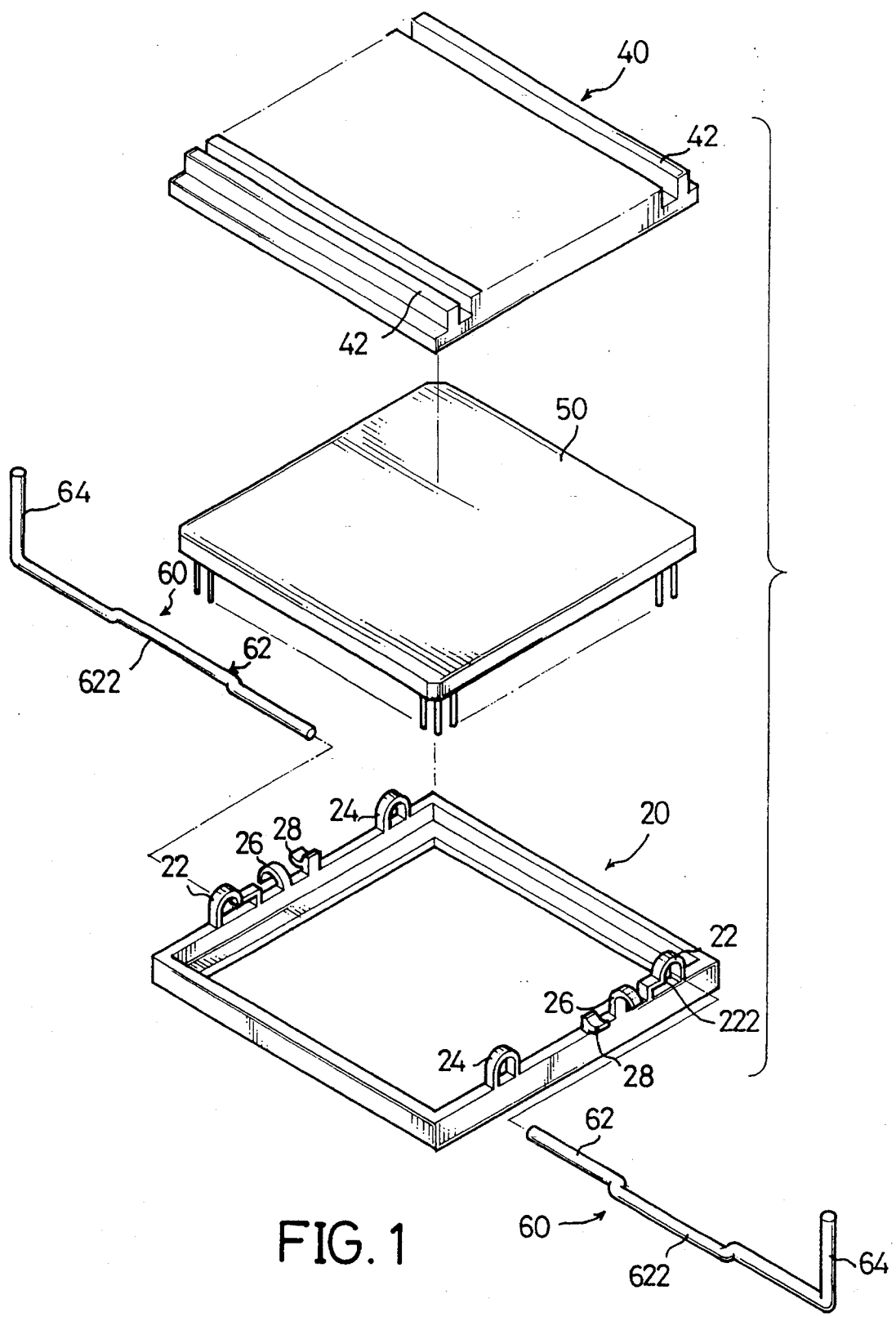
FIG. 1 shows an exploded view of a retainer frame assembly in accordance with a first embodiment of the present invention.

Referring to the drawings, and initially to FIG. 1, a retainer frame assembly for dissipating heat generated on an integrated circuit chip comprises a base frame 20 of a generally rectangular shape, a heat-dissipating cover 40 having a number of fins 42 thereon, and one or more movable rods 60. Although in one embodiment two movable rods are shown and in another embodiment only one is shown, it is sufficient to describe the structure and operation of only one movable and apply the same situation to the others.

The base frame 20 is configured to enclose a chip 50, for example a central processing unit (CPU), which can be either plugged-in or surface-mounted to a printed circuit board. The base frame 20 has a first positioning piece 22 on one side thereof and a second positioning piece 24 on an opposite side thereof. The first positioning piece 22 has a substantially L-shaped hole 222. The base frame 20 further has a first and a second complementary locking pieces 26 and 28 adjacent to the first positioning piece 22. The first and second locking pieces 26 and 28 are proximate to each other and are open toward opposite directions, i.e., the first locking piece 26 is open toward a bottom of the base frame 20 and the second locking piece 28 is open toward a top. The first locking piece 26 is slightly resiliently displaceable sidewards so that, as will be seen later, the movable rod 60 is movable into and lockable by these two locking pieces 26 and 28.

The heat-dissipating cover 40 is to be disposed on the chip 50 enclosed by the base frame 20. The plurality of parallel, spaced longitudinal fins 42 on an upper side thereof are generally of a known design which will not be further described.

The movable rod 60 is substantially L-shaped with a long arm 62 extending in a direction parallel to a longitudinal direction of the fins 42 and a short arm 64 perpendicular to the long arm 62. The long arm 62 is substantially straight but it has an intermediate portion 622 offset from the remaining portion in a direction substantially perpendicular to a plane defined by the long and short arms 62 and 64.

Figure 2:
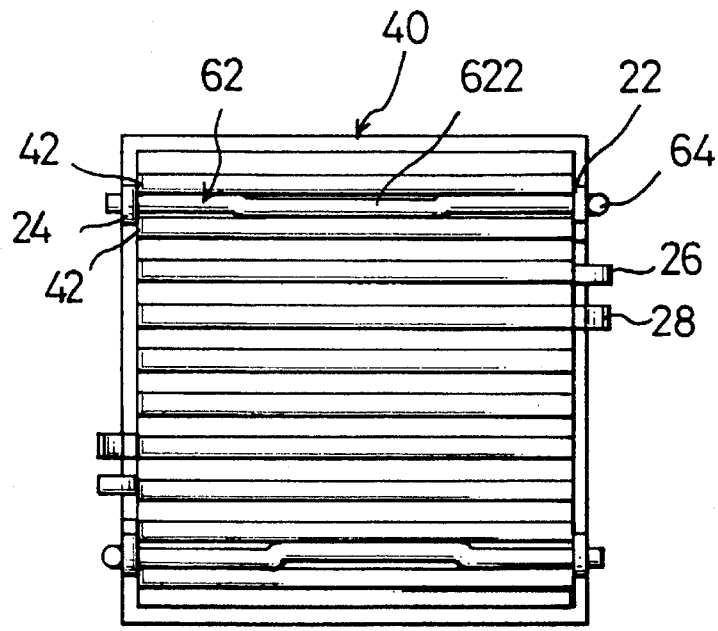
FIG. 2 is a top plan view of the assembled frame assembly of FIG. 1 in a released position.
Figure 3:
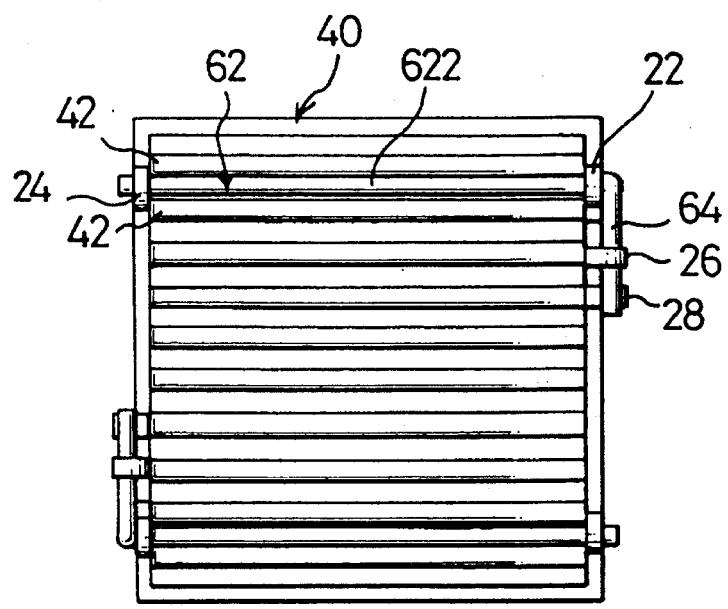
FIG. 3 is a top plan view of the assembled frame assembly of FIG. 1 in a locked position.

Referring to FIG. 2, a top plan view of the assembled frame assembly of FIG. 1 is shown in a non-locked position. In this non-locked position, it can be seen that when the cover 40 is placed on the top of the chip 50 and the rod 60 is inserted into the first and second positioning pieces 22 and 24, the rod 60 simply rests upon the cover 40 between two adjacent fins 42 with the entire long arm 62 in contact with the cover 40. When the rod 60 is rotated by manipulating the short arm 64 with respect to the positioning pieces 22 and 24 in a direction corresponding to that of the intermediate portion 622 offset from the remaining portion of the long arm 62, as shown in FIG. 3, the rod 60 will urge the heat-dissipating cover 40 downward toward the base frame 20. In this locked position, it is noted that the rod 60 pressingly retains the cover 40 on the chip 50. FIG. 3 further shows that it is the intermediate portion 622 of the long arm 62 which urges the heat-dissipating cover 40 to closely contact the chip. Before changing into the locked position from the non-locked position, the first locking piece 26 is slightly pressed sideward. The first locking piece 26 then will return back to a normal unflexed position due to its springy nature when the short arm 64 rests on the second locking piece 28.

Figure 4:
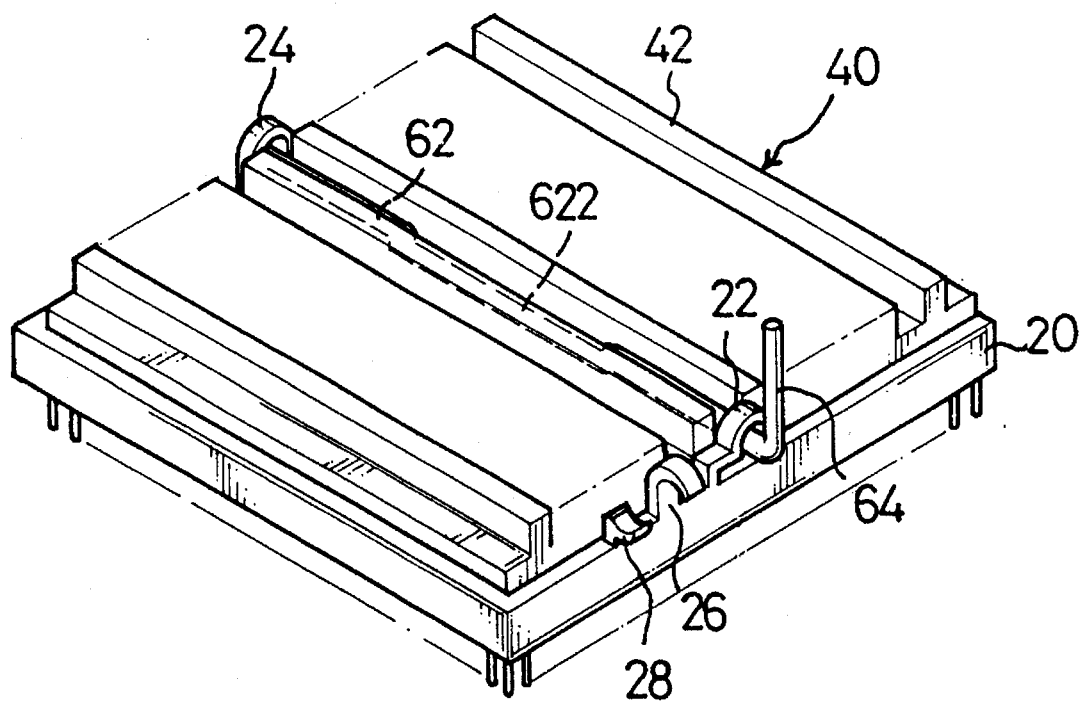
FIG. 4 shows a perspective view of a retainer frame assembly in accordance with a second embodiment of the present invention.

FIG. 4 shows another embodiment of the invention in which comprises only one set of first and second positioning pieces 22 and 24 and first and second locking pieces 26 and 28, instead of two sets as is employed in the above embodiment.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A retainer frame assembly for dissipating heat generated on an integrated circuit chip, comprising:

a base frame configured to enclose a chip, said base frame having at least one retaining means along an upper peripheral edge thereof;

a heat-dissipating cover to be disposed on the chip enclosed by said base frame, said cover having a plurality of parallel, spaced longitudinal fins on an upper side thereof; and a movable rod rotatably movable with respect to said retaining means for releasably urging said heat-dissipating cover toward said base frame, thereby pressingly securing said cover on the chip.

2. The retainer frame assembly as claimed in claim 1, wherein:

said retaining means comprises:

a first positioning piece on one side of said base frame and a second positioning piece on an opposite side of said base frame, said first positioning piece having an L-shaped hole; and a first and a second complementary locking pieces adjacent to said first positioning piece; and said movable rod is substantially L-shaped with a long arm extending in a direction parallel to a longitudinal direction of said fins and a short arm perpendicular to said long arm, said long arm being substantially straight and having an intermediate portion offset from the remaining portion in a direction perpendicular to a plane defined by said long and short arms;

whereby a rotational movement of said movable rod about its long arm within and with respect to said first and second positioning pieces from a non-locked position in which said long arm of said movable rod loosely rests on said heat-dissipating cover between two adjacent fins to a locked position in which said intermediate portion of said long arm urges said heat-dissipating cover to closely contact the chip.

3. The retainer frame assembly as claimed in claim 2, wherein said first and second locking pieces are proximate to each other and are open toward opposite directions, said first locking piece being resiliently displaceable so that said movable rod is movable into and lockable by said locking pieces.

* * * * *